United States Patent
Lee

(10) Patent No.: US 12,439,532 B2
(45) Date of Patent: Oct. 7, 2025

(54) ROLLABLE DISPLAY DEVICE

(71) Applicant: Samsung Display Co., LTD., Yongin-si (KR)

(72) Inventor: Won Beom Lee, Pyeongtaek-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 414 days.

(21) Appl. No.: 17/987,049

(22) Filed: Nov. 15, 2022

(65) Prior Publication Data

US 2023/0328906 A1    Oct. 12, 2023

(30) Foreign Application Priority Data

Apr. 6, 2022    (KR) .................. 10-2022-0042618

(51) Int. Cl.
*G06F 1/16* (2006.01)
*F16M 11/04* (2006.01)
*F16M 11/18* (2006.01)
*G09F 9/30* (2006.01)
*H05K 5/00* (2006.01)
*H05K 5/02* (2006.01)

(52) U.S. Cl.
CPC ......... *H05K 5/0204* (2013.01); *F16M 11/046* (2013.01); *F16M 11/18* (2013.01); *G09F 9/301* (2013.01); *H05K 5/0018* (2022.08); *F16M 2200/061* (2013.01)

(58) Field of Classification Search
CPC ....... G06F 1/1601; G06F 1/1652; G09F 9/301
See application file for complete search history.

(56) References Cited

U.S. PATENT DOCUMENTS

| | | | |
|---|---|---|---|
| 10,976,775 B1 | 4/2021 | Cha | |
| 12,238,879 B2 * | 2/2025 | Choi | B32B 3/08 |
| 2020/0201394 A1 * | 6/2020 | Choi | H05K 5/0017 |
| 2020/0241599 A1 * | 7/2020 | Pyo | G09F 9/301 |
| 2023/0164934 A1 * | 5/2023 | Park | G06F 1/1652 |
| | | | 361/807 |
| 2023/0213140 A1 * | 7/2023 | Kim | H05K 5/0247 |
| | | | 361/679.01 |
| 2023/0247892 A1 * | 8/2023 | Kim | G09F 9/335 |
| | | | 361/807 |
| 2023/0397473 A1 * | 12/2023 | Jeong | H10K 77/111 |
| 2024/0032214 A1 * | 1/2024 | Jiang | H05K 5/0217 |

FOREIGN PATENT DOCUMENTS

| | | |
|---|---|---|
| KR | 1020160013289 | 2/2016 |
| KR | 1020200004003 | 1/2020 |
| KR | 1020200143084 | 12/2020 |

* cited by examiner

*Primary Examiner* — Anthony Q Edwards
(74) *Attorney, Agent, or Firm* — CANTOR COLBURN LLP

(57) ABSTRACT

A rollable display device includes a display panel; a support disposed on a rear surface of the display panel; a fixing bracket to which a first end of the support and a first end of the display panel are fixed; a roller to which a second end of the support is fixed; a first link including a first end coupled to the fixing bracket; a second link including a first end fastened to a second end of the first link; and a driver connected to a second end of the second link.

20 Claims, 13 Drawing Sheets

ROLLABLE DISPLAY DEVICE

This application claims priority to Korean Patent Application No. 10-2022-0042618, filed on Apr. 6, 2022, and all the benefits accruing therefrom under 35 U.S.C. 119, the content of which in its entirety is herein incorporated by reference.

BACKGROUND

1. Field

The present disclosure relates to a rollable display device.

2. Description of the Related Art

With the development of information technology, the market for display devices, which are connection media between users and information, is increasing. Accordingly, display devices such as an organic light emitting display device and a liquid crystal display (LCD) device have been widely used in various fields.

Among the display devices, the organic light emitting diode display device is a self-light emitting device, and thus may be manufactured to have lower power consumption and be thinner than the liquid crystal display device that includes a back light. In addition, the organic light emitting diode display device has desired characteristics of a wide viewing angle and a fast response speed. The organic light emitting diode display device has been developed to the level of large-screen mass-production technology in view of process technology and thus its market is expanding while competing with the LCD device.

Pixels of the organic light emitting diode display device include an organic light emitting diode (OLED) that is a self-emitting device. The OLED display device may be categorized into various types depending on a type of a light emitting material, a light emitting method, a light emitting structure, and a driving method. The OLED display device may be categorized into fluorescent light emission and phosphorescent light emission depending on a light emitting method, and may be categorized into a top emission structure and a bottom emission structure depending on a light emitting structure. In addition, the OLED display device may be categorized into a passive matrix OLED (PMOLED) and an active matrix OLED (AMOLED) depending on the driving method.

Recently, a flexible display device has been commercialized. The flexible display device may reproduce an input image on a screen of a display panel on which a plastic OLED is formed. The plastic OLED is formed on a bendable plastic substrate. The flexible display device may implement various designs, and has advantages in portability and durability. The flexible display device may be implemented as various types of display devices such as a bendable display device, a foldable display device, and a rollable display device. Such a flexible display device may be applied to a television (TV), car display devices, and wearable devices as well as mobile devices such as smart phones and tablet personal computers (PCs), and its application field is expanding.

SUMMARY

Embodiments of the disclosure provide a rollable display device in which a display panel may be subjected to rolling/unrolling.

An embodiment of a rollable display device includes a display panel; a support disposed on a rear surface of the display panel; a fixing bracket to which a first end of the support and a first end of the display panel are fixed; a roller to which a second end of the support is fixed; a first link including a first end coupled to the fixing bracket; a second link including a first end fastened to a second end of the first link; and a driver connected to a second end of the second link.

An embodiment of a rollable display device includes a display panel; a fixing bracket to which a first end of the display panel is fixed; a first link at a first side and a first link at a second side, which are rotatably coupled to sides of the fixing bracket, respectively; a second link at a first side connected to the first link at the first side, and a second link at a second side connected to the first link at the second side; and a driver which simultaneously drives the second link at the first side and the second link at the second side.

According to embodiments of the disclosure, a rollable display device may be provided in which a display panel may be subjected to rolling/unrolling.

The effects according to the embodiments of the present disclosure are not limited to those mentioned above and more various effects are included in the following description of the present disclosure.

BRIEF DESCRIPTION OF THE DRAWINGS

The above and other features of the disclosure will become more apparent by describing in detail embodiments thereof with reference to the accompanying drawings, in which.

DETAILED DESCRIPTION

Figure 1A:
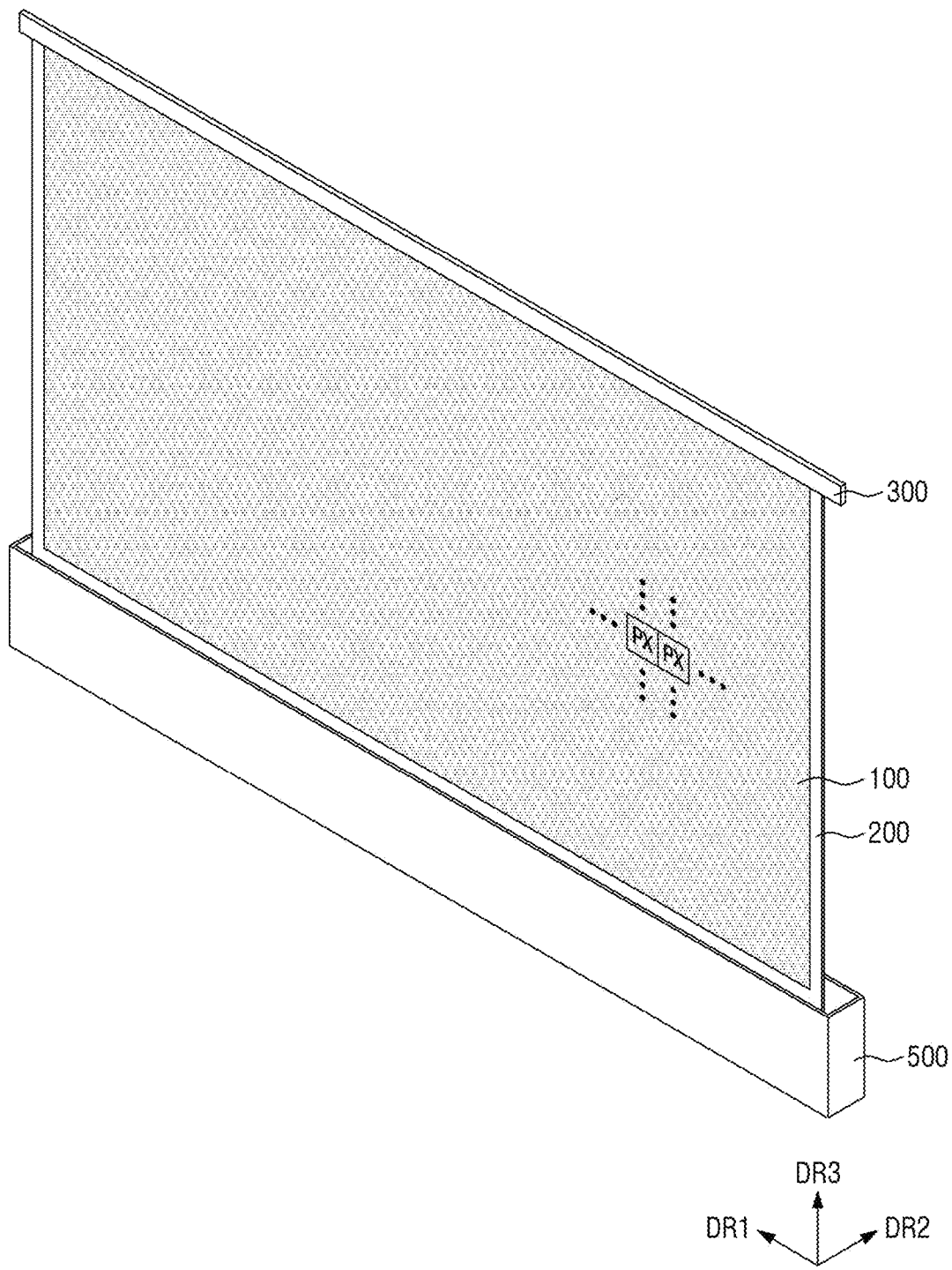
FIG. 1A is a perspective view illustrating a rollable display device according to an embodiment.

The present invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in detail with reference to the accompanying drawings.

Figure 1B:
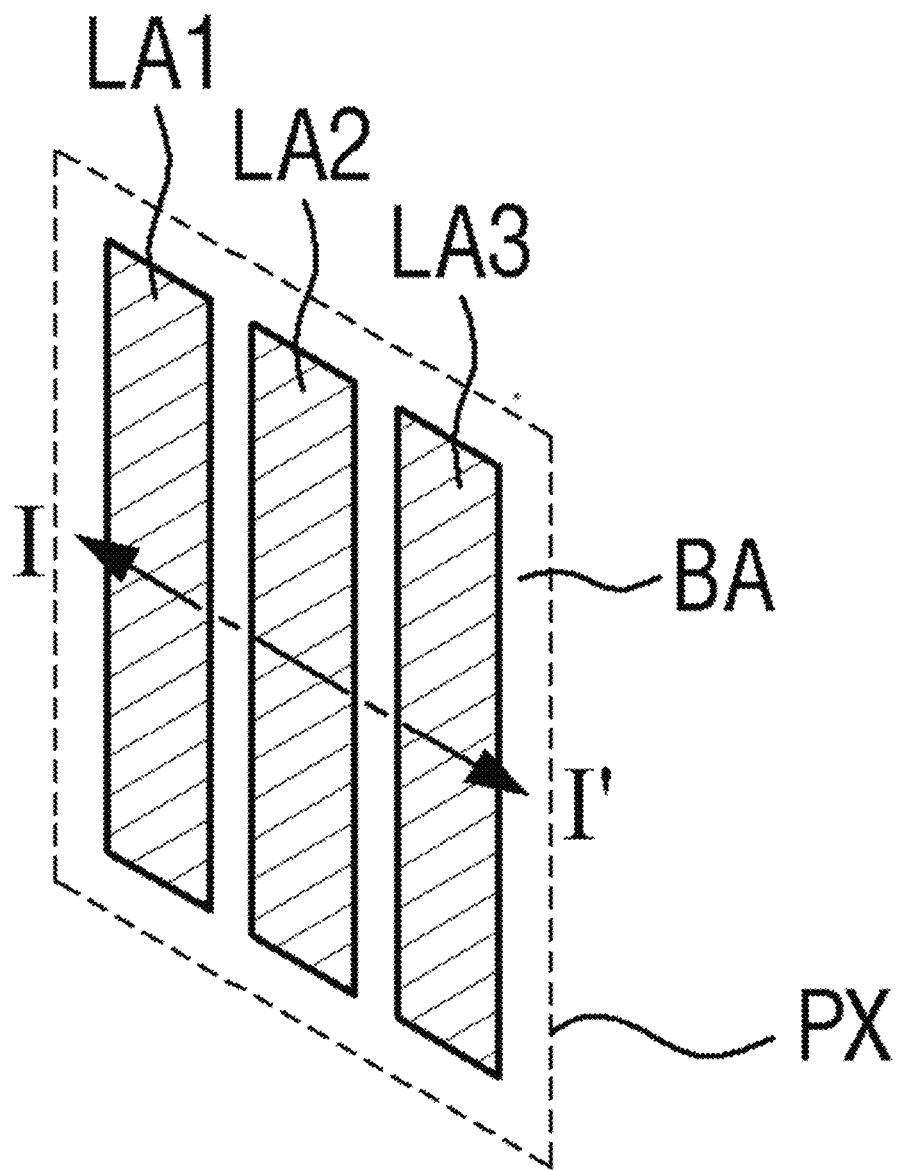
FIG. 1B is an enlarged view of a display pixel of FIG. 1A.
Figure 2:
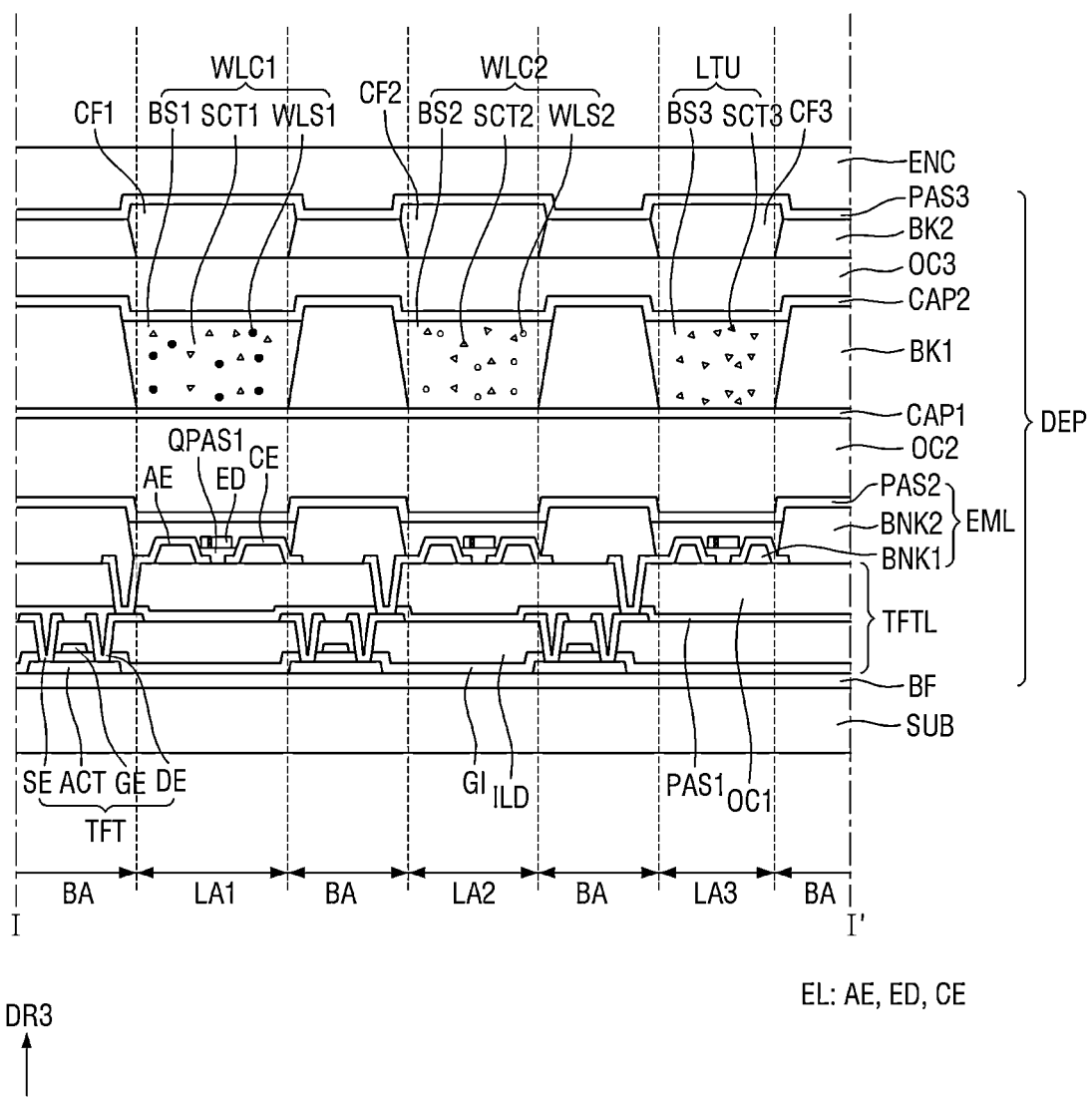
FIG. 2 is a cross-sectional view taken along line I-I' of FIG. 1B.
Figure 3:
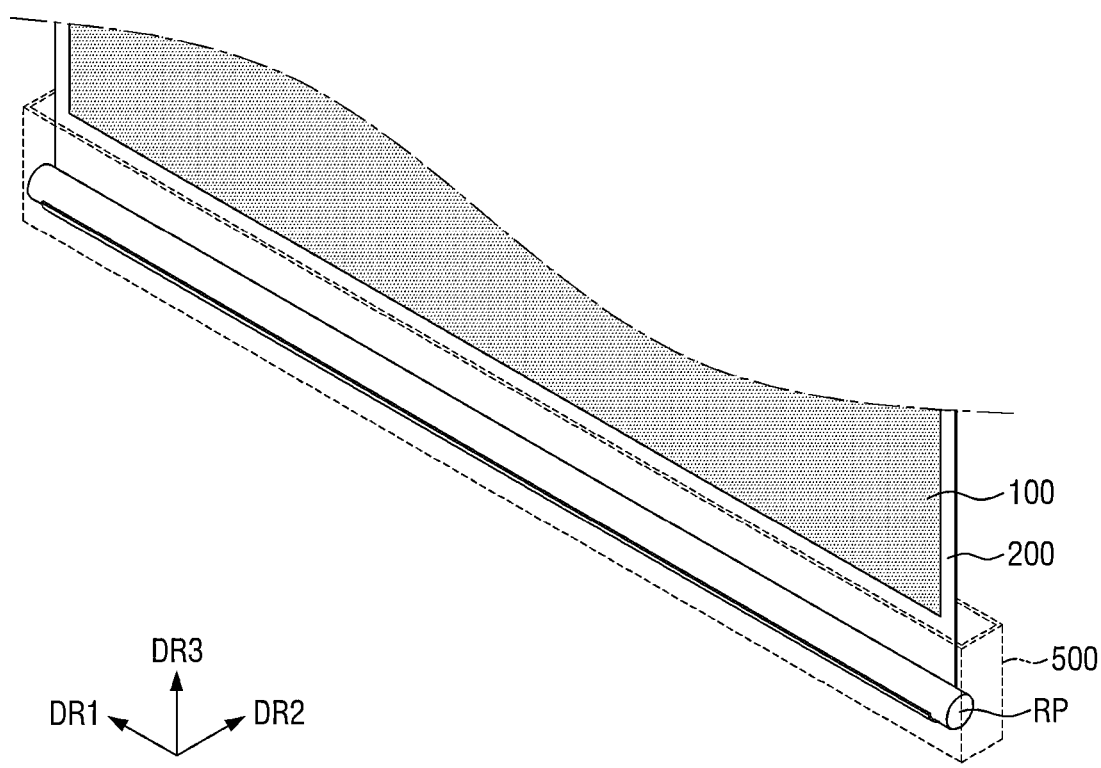
FIG. 3 is a perspective view illustrating a roller in an accommodating portion of FIG. 1A, and a display panel fixed to the roller.
Figure 4:
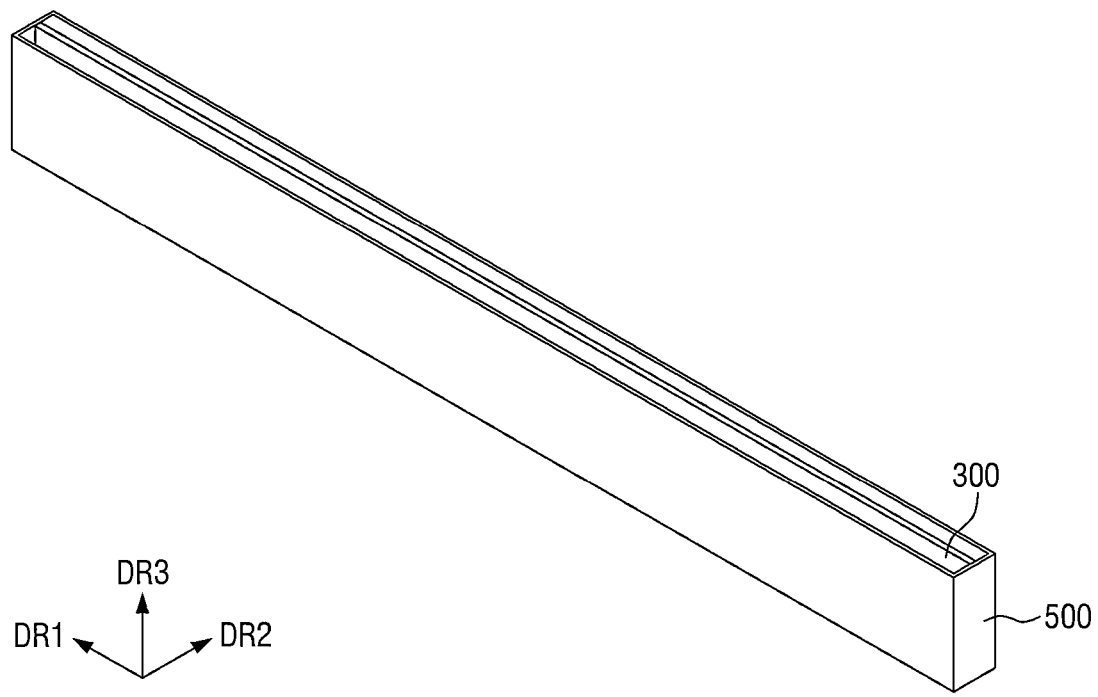
FIG. 4 is a perspective view illustrating a display panel of FIG. 1A in a rolled state.
Figure 5:
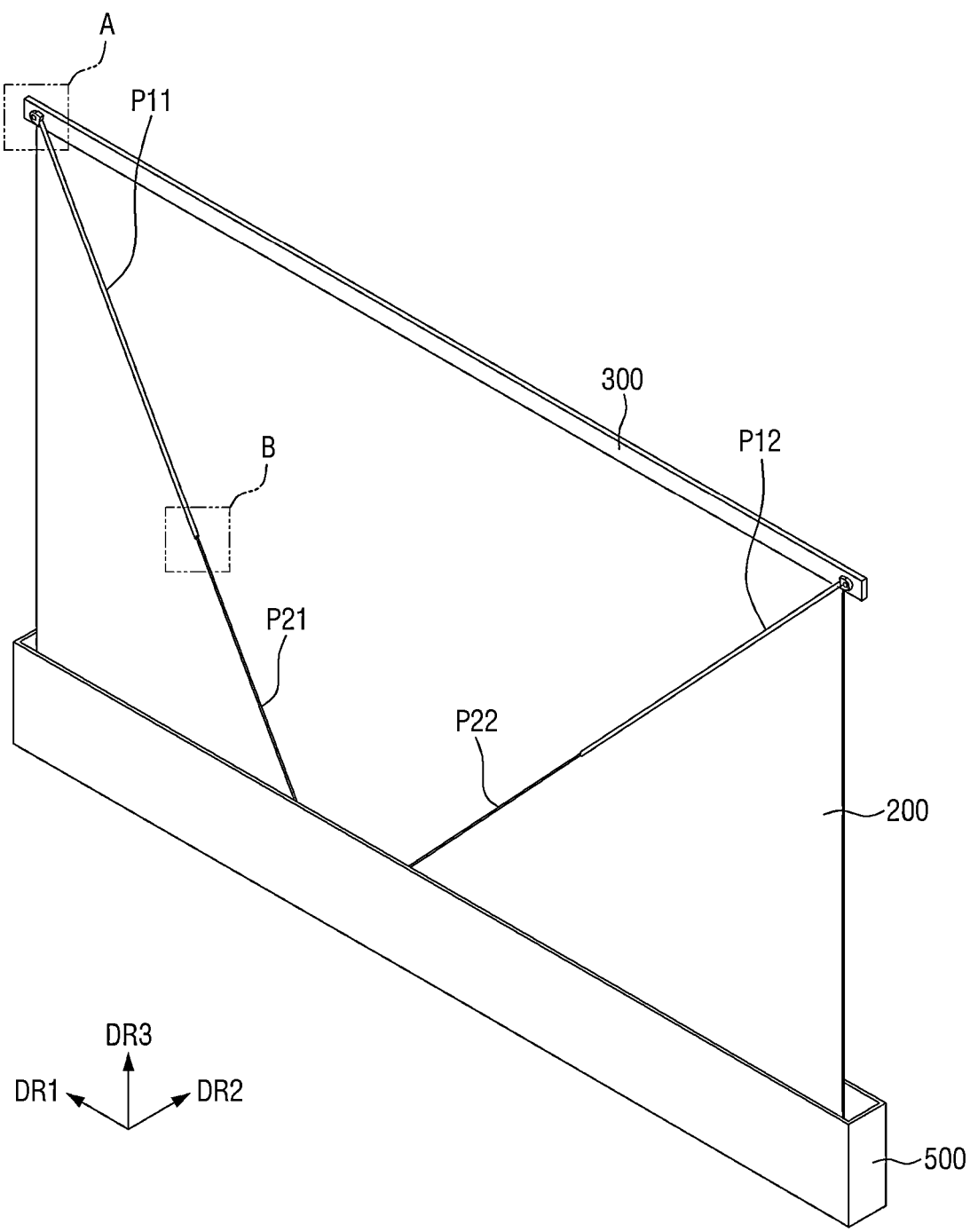
FIG. 5 is a perspective view illustrating a rear surface of a rollable display device of FIG. 1A.
Figure 6:
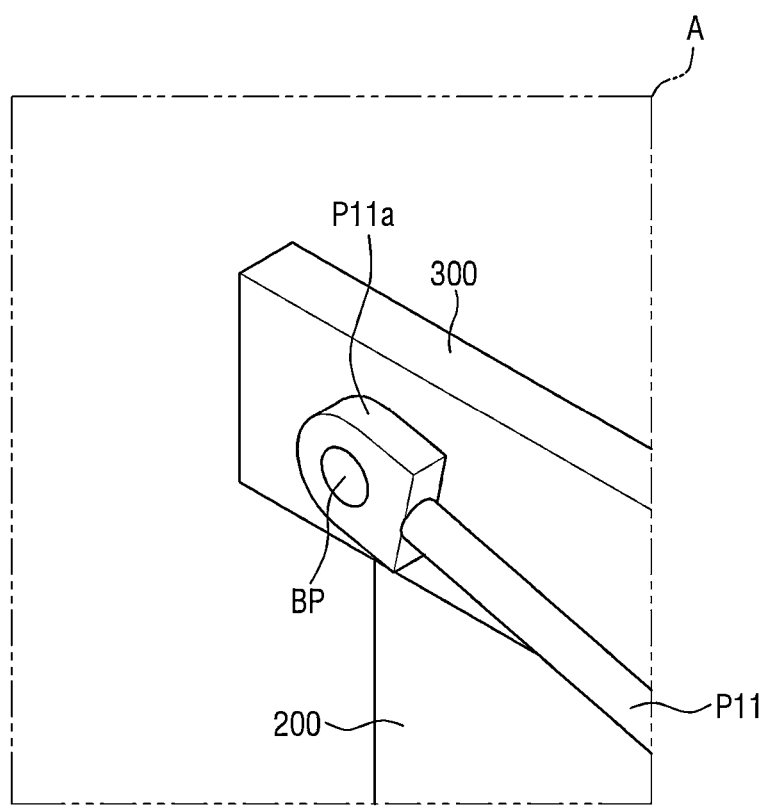
FIG. 6 is an enlarged perspective view illustrating an area A of FIG. 5.
Figure 7:
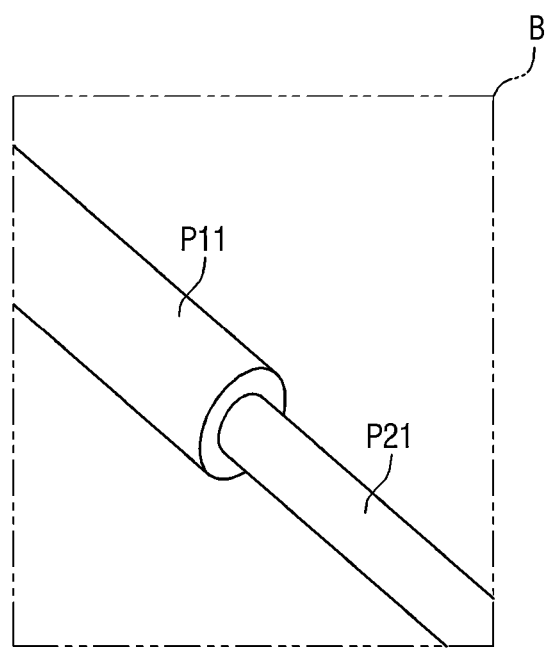
FIG. 7 is an enlarged perspective view illustrating an area B of FIG. 5.
Figure 8:
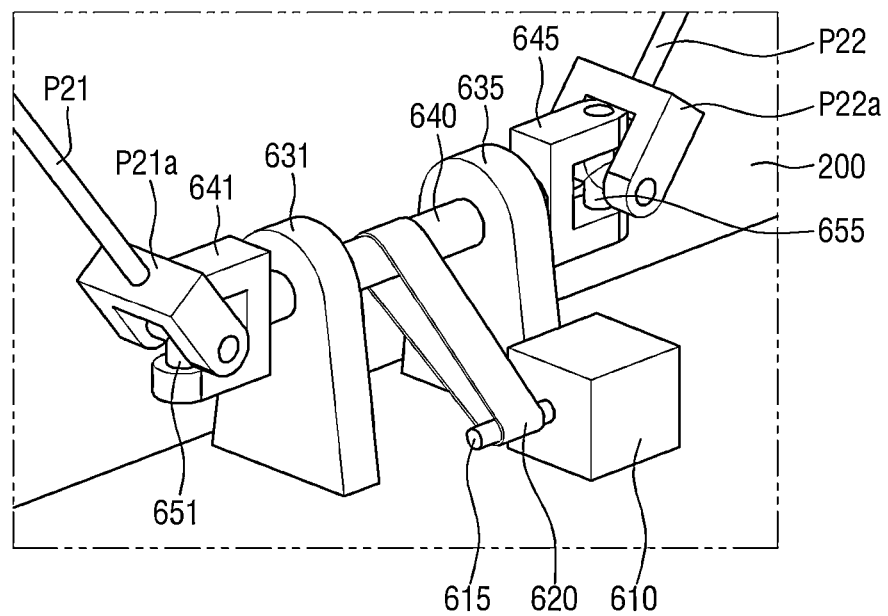
FIGS. 8 and 9 are detailed perspective views illustrating a driver of a rollable display device shown in FIG. 5.
Figure 9:
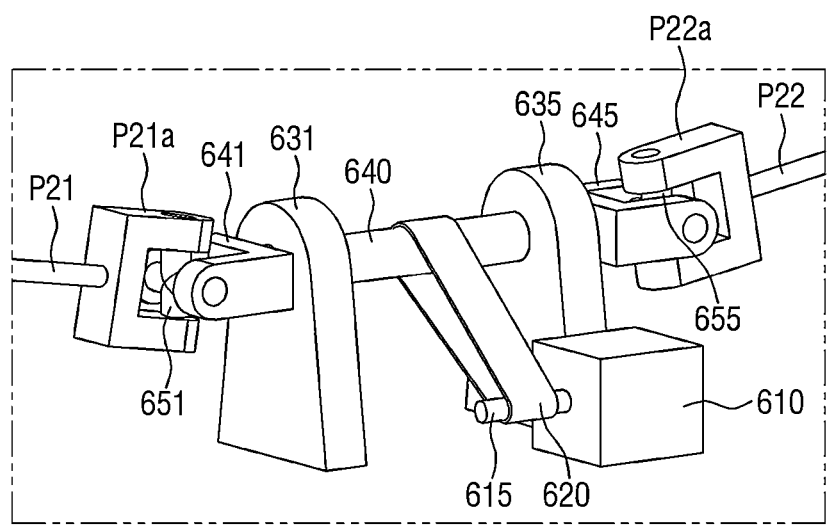

FIG. 1A is a perspective view illustrating a rollable display device according to an embodiment. FIG. 1B is an enlarged view of a display pixel of FIG. 1A. FIG. 2 is a cross-sectional view taken along line I-I' of FIG. 1B. FIG. 3 is a perspective view illustrating a roller in an accommodating portion of FIG. 1A, and a display panel fixed to the roller. FIG. 4 is a perspective view illustrating a display panel of FIG. 1 in in a rolled state. FIG. 5 is a perspective view illustrating a rear surface of a rollable display device of FIG. 1A. FIG. 6 is an enlarged perspective view illustrating an area A of FIG. 5. FIG. 7 is an enlarged perspective view illustrating an area B of FIG. 5. FIGS. 8 and 9 are detailed perspective views illustrating a driver of a rollable display device of FIG. 5.

Referring to FIGS. 1A to 8, an embodiment of the rollable display device may include a display panel 100, a fixing bracket 300 to which one end (a first end) of the display panel 100 is fixed, a roller RP to which an opposing end (a second end or an end opposite to the one end, hereinafter will be referred to as the other end) of the display panel 100 is fixed, a first link P11 having one end fixed to a connection member BP on the fixing bracket 300, a driver disposed around the roller RP to rotate the roller RP, and a second link including one end (or a first end) fastened to the first link and an opposing end (a second end or an end opposite to the one end, hereinafter will be referred to as the other end) connected to the driver.

The display panel 100 may include first edges extended along a first direction DR1, and second edges extended along a second direction DR2. The first direction DR1 and the second direction DR2 may cross each other. The first edges may be long side edges, and the second edges may be short side edges, but the edges are not limited thereto. The first edges of the display panel 100 may include one side edge (a first side edge) in a third direction DR3 and an opposing side edge end (a second side edge or a side edge opposite to the one side edge, hereinafter will be referred to as the other side edge) in the third direction DR3. The one side edge in the third direction DR3 of the display panel 100 may correspond to the other end of the display panel 100, and the other side edge in the third direction DR3 of the display panel 100 may correspond to the one end of the display panel 100. The other end of the display panel 100 may be fixed to the fixing bracket 300. In an embodiment, a support 200 may be further disposed on the rear surface of the display panel 100. One end of the support 200 may be fixed to the roller RP, and the other end of the support 200 may be fixed to the fixing bracket 300.

The display panel 100 may include a liquid crystal display panel, an organic light emitting diode display panel, an inorganic light emitting diode display panel, or a quantum dot display panel. Hereinafter, for convenience of description, embodiments where the display panel 100 is an inorganic light emitting diode display panel will be described in detail.

Predetermined ductility (or flexibility) may be given to the display panel 100, and thus an operation of rolling (or winding) or unrolling (or unwinding) along an outer circumferential surface of the fixing bracket 300 may be easily and repeatedly performed for the display panel 100.

The display panel 100 may include one surface (a first surface) and an opposing surface (a second surface or a surface opposite to the one surface, hereinafter will be referred to as the other surface). The one surface of the display panel 100 may be a display surface. Herein, "one" element and "the other" element may be referred to as a "first" element and a "second" element, respectively. A detailed stacked structure of the display panel 100 is shown in FIG. 2.

As shown in FIG. 1A, the display panel 100 may include display pixels PX for displaying an image. Detailed elements of the display pixel PX are shown in FIG. 2.

Referring to FIG. 1B, the display pixel PX of the display device may include light emission areas LA1, LA2 and LA3 defined by a pixel defining layer, and a non-light emission area BA disposed near each of the light emission areas LA1, LA2 and LA3, and may emit light having a predetermined peak wavelength through the light emission areas LA1, LA2 and LA3. In an embodiment, for example, the display pixel PX of the display device may include first to third light emission areas LA1, LA2 and LA3. Each of the first to third light emission areas LA1, LA2 and LA3 may be an area where light generated from a light emitting element of the display device is emitted to the outside of the display panel.

The first to third light emission areas LA1, LA2 and LA3 may emit light having a predetermined peak wavelength to the outside of the display device. The first light emission area LA1 may emit light of a first color, the second light emission area LA2 may emit light of a second color, and the third light emission area LA3 may emit light of a third color. In an embodiment, for example, the light of the first color may be red light having a peak wavelength in a range of 610 nanometers (nm) to 650 nm, the light of the second color may be green light having a peak wavelength in a range of 510 nm to 550 nm, and the light of the third color may be blue light having a peak wavelength in a range of 440 nm to 480 nm, but the disclosure is not limited thereto.

Referring to FIG. 2, an embodiment of the display panel 100 may include a substrate portion SUB, a display element layer DEP on the substrate portion SUB, and an encapsulation member ENC disposed over a display area DA and a non-display area NDA to seal the display element layer DEP.

The substrate portion SUB may include or be made of an insulating material such as a polymer resin. The insulating material may include, for example, polyimide (PI), but is not limited thereto. The substrate portion SUB may be flexible.

The display element layer DEP may include a buffer layer BF, a thin film transistor layer TFTL, a light emitting element layer EML, a second planarization layer OC2, a first capping layer CAP1, a first light shielding member BK1, a first wavelength converter WLC1, a second wavelength converter WLC2, a light-transmissive unit LTU, a second capping layer CAP2, a third planarization layer OC3, a second light shielding member BK2, first to third color filters CF1, CF2 and CF3 and a third passivation layer PAS3.

The buffer layer BF may be disposed on the substrate portion SUB. The buffer layer BF may include or be made of an inorganic layer capable of preventing permeation of the air or moisture.

The thin film transistor layer TFTL may include a thin film transistor TFT, a gate insulating layer GI, an interlayer dielectric layer ILD, a first passivation layer PAS1, and a first planarization layer OC1.

The thin film transistor TFT may be disposed on the buffer layer BF, and may constitute a pixel circuit of each of the plurality of pixels.

The semiconductor layer ACT of the thin film transistor TFT may be disposed on the buffer layer BF. The semiconductor layer ACT may overlap a gate electrode GE of the thin film transistor TFT, a source electrode SE of the thin film transistor TFT, and a drain electrode DE of the thin film transistor TFT. The semiconductor layer ACT may be in direct contact with the source electrode SE and the drain electrode DE, and may face the gate electrode GE with the gate insulating layer GI interposed therebetween.

The gate electrode GE may be disposed on the gate insulating layer GI. The gate electrode GE may overlap the semiconductor layer ACT with the gate insulating layer GI interposed therebetween.

The source electrode SE and the drain electrode DE may be spaced apart from each other on the interlayer dielectric layer ILD. The source electrode SE may be in contact with one end of the semiconductor layer ACT through a contact hole defined in the gate insulating layer GI and the interlayer dielectric layer ILD. The drain electrode DE may be in contact with another end of the semiconductor layer ACT through the contact hole defined in the gate insulating layer GI and the interlayer dielectric layer ILD. The drain electrode DE may be connected to a first electrode AE of a light emitting member EL through a contact hole defined in the first passivation layer PAS1 and the first planarization layer OC1.

The gate insulating layer GI may be disposed on the semiconductor layer ACT. In an embodiment, for example, the gate insulating layer GI may be disposed on the semiconductor layer ACT and the buffer layer BF, and may insulate the semiconductor layer ACT from the gate electrode GE. The gate insulating layer GI may include a contact hole through which the source electrode SE passes and a contact hole through which the drain electrode DE passes.

The interlayer dielectric layer ILD may be disposed on the gate electrode GE. In an embodiment, for example, the interlayer dielectric layer ILD may include a contact hole through which the source electrode SE passes and a contact hole through which the drain electrode DE passes.

The first passivation layer PAS1 may be provided on the thin film transistor TFT to protect the thin film transistor TFT. In an embodiment, for example, the first passivation layer PAS1 may include a contact hole through which the first electrode AE passes.

The first planarization layer OC1 may be provided on the first passivation layer PAS1 to planarize an upper end of the thin film transistor TFT. In an embodiment, for example, the first planarization layer OC1 may include a contact hole through which the first electrode AE of the light emitting member EL passes.

The light emitting element layer EML may include a light emitting member EL, a first bank BNK1, a second bank BNK2, a first element insulating layer QPAS1, and a second passivation layer PAS2.

The light emitting member EL may be disposed on the thin film transistor TFT. The light emitting member EL may include a first electrode AE, a second electrode CE, and a light emitting element ED.

The first electrode AE may be disposed on the first planarization layer OC1. In an embodiment, for example, the first electrode AE may be disposed on the first bank BNK1 disposed on the first planarization layer OC1 to cover the first bank BNK1. The first electrode AE may be disposed to overlap one of the first to third light emission areas LA1, LA2 and LA3 defined by the second bank BNK2. The first electrode AE may be connected to the drain electrode DE of the thin film transistor TFT.

The second electrode CE may be disposed above the first planarization layer OC1. In an embodiment, for example, the second electrode CE may be disposed on the first bank BNK1 disposed on the first planarization layer OC1 to cover the first bank BNK1. The second electrode CE may be disposed to overlap one of the first to third light emission areas LA1, LA2 and LA3 defined by the second bank BNK2. In an embodiment, for example, the second electrode CE may receive a common voltage supplied to the entire pixels.

The first element insulating layer QPAS1 may cover a portion of the first electrode AE and a portion of the second electrode CE, which are adjacent to each other, and may insulate the first electrode AE from the second electrode CE.

The light emitting element ED may be disposed between the first electrode AE and the second electrode CE above the first planarization layer OC1. The light emitting element ED may be disposed on the first element insulating layer QPAS1. One end of the light emitting element ED may be connected to the first electrode AE, and another end of the light emitting element ED may be connected to the second electrode CE. In an embodiment, for example, the plurality of light emitting elements ED may include active layers having a same material to emit light of a same wavelength range, or light of a same color. The light emitted from each of the first to third light emission areas LA1, LA2 and LA3 may have a same color as each other. In an embodiment, for example, the plurality of light emitting elements ED may emit light of a third color or blue light, which has a peak wavelength in a range of 440 nm to 480 nm.

The second bank BNK2 may be disposed on the first planarization layer OC1 to define the first to third light emission areas LA1, LA2 and LA3. In an embodiment, for example, the second bank BNK2 may surround each of the first to third light emission areas LA1, LA2 and LA3, but is not limited thereto. The second bank BNK2 may be disposed in a light shielding area BA.

The second passivation layer PAS2 may be disposed on the plurality of light emitting members EL and the second bank BNK2. The second passivation layer PAS2 may cover the plurality of light emitting members EL and protect the plurality of light emitting members EL.

The display panel 100 may further include the second planarization layer OC2, the first capping layer CAP1, the first light shielding member BK1, the first wavelength converter WLC1, the second wavelength converter WLC2, the light-transmissive unit LTU, the second capping layer CAP2, the third planarization layer OC3, the second light shielding member BK2, the first to third color filters CF1, CF2 and CF3 and the third passivation layer PAS 3.

The second planarization layer OC2 may be disposed on the light emitting element layer EML to planarize an upper end of the light emitting element layer EML. The second planarization layer OC2 may include an organic material.

The first capping layer CAP1 may be disposed on the second planarization layer OC2. The first capping layer CAP1 may seal lower surfaces of the first and second wavelength converters WLC1 and WLC2 and the light-transmissive unit LTU. The first capping layer CAP1 may include an inorganic material.

The first light shielding member BK1 may be disposed in the light shielding area BA on the first capping layer CAP1. The first light shielding member BK1 may overlap the second bank BNK2 in a thickness direction or the third direction DR3. The first light shielding member BK1 may shield transmission of light.

The first light shielding member BK1 may include an organic light shielding material and a liquid repellent component.

The first light shielding member BK1 may include a liquid repellent component to separate the first and second wavelength converters WLC1 and WLC2 and the light-transmissive unit LTU into corresponding light emission areas LA.

The first wavelength converter WLC1 may be disposed in the first light emission area LA1 of the first capping layer CAP1. The first wavelength converter WLC1 may be surrounded by the first light shielding member BK1. The first wavelength converter WLC1 may include a first base resin BS1, a first scatterer SCT1, and a first wavelength shifter WLS1.

The first base resin BS1 may include a material having relatively high light transmittance. The first base resin BS1 may include or be made of a transparent organic material. In an embodiment, for example, the first base resin BS1 may include at least one of an organic material such as an epoxy-based resin, an acrylic resin, a cardo-based resin, or an imide-based resin.

The first scatterer SCT1 may have a refractive index different from that of the first base resin BS1, and may form an optical interface with the first base resin BS1.

The first wavelength shifter WS1 may convert or shift the peak wavelength of incident light to a first peak wavelength. In an embodiment, for example, the first wavelength shifter WLS1 may convert blue light provided from the display device into red light having a single peak wavelength in a range of 610 nm to 650 nm and emit the red light. The first wavelength shifter WS1 may be a quantum dot, a quantum rod, or a phosphor. The quantum dot may be a granular material that emits light of a specific color while electrons are transited from a conduction band to a valence band.

The light emitted by the first wavelength shifter WLS1 may have a full width of half maximum (FWHM) of 45 nm or less, or 40 nm or less, or 30 nm or less, and color purity and color reproducibility of a color displayed by the display device may be further improved.

A portion of the blue light provided from the light emitting element layer EML may transmit the first wavelength converter WLC1 without being converted into red light by the first wavelength shifter WLS1. Among the blue light provided from the light emitting element layer EML, light that is incident on the first color filter CF1 without being converted by the first wavelength converter WLC1 may be shielded by the first color filter CF1. In addition, among the blue light provided from the display device, the red light converted by the first wavelength converter WLC1 may be emitted to the outside by transmitting the first color filter CF1. Therefore, the first light emission area LA1 may emit the red light.

The second wavelength converter WLC2 may be disposed in the second light emission area LA2 on the first capping layer CAP1. The second wavelength converter WLC2 may be surrounded by the first light shielding member BK1. The second wavelength converter WLC2 may include a second base resin BS2, a second scatterer SCT2, and a second wavelength shifter WLS2.

The second base resin BS2 may include a material having relatively high light transmittance. The second base resin BS2 may include or be made of a transparent organic material.

The second scatterer SCT2 may have a refractive index different from that of the second base resin BS2, and may form an optical interface with the second base resin BS2. In an embodiment, for example, the second scatterer SCT2 may include a light scattering material or light scattering particles that scatter at least a portion of transmissive light.

The second wavelength shifter WLS2 may convert or shift a peak wavelength of incident light to a second peak wavelength different from the first peak wavelength of the first wavelength shifter WLS1. In an embodiment, for example, the second wavelength shifter WLS2 may convert the blue light provided from the display device into green light having a single peak wavelength in a range of 510 nm to 550 nm and emit the green light. The second wavelength shifter WLS2 may be a quantum dot, a quantum rod, or a phosphor. The second wavelength shifter WLS2 may include the same material as the material exemplified in the first wavelength shifter WLS1.

The light-transmissive unit LTU may be disposed on the third light emission area LA3 on the first capping layer CAP1. The light-transmissive unit LTU may be surrounded by the first light shielding member BK1. The light-transmissive unit LTU may maintain a peak wavelength of incident light to transmit the incident light. The light-transmissive unit LTU may include a third base resin BS3 and a third scatterer SCT3.

The third base resin BS3 may include a material having relatively high light transmittance. The third base resin BS3 may include or be made of a transparent organic material.

The third scatterer SCT3 may have a refractive index different from that of the third base resin BS3, and may form an optical interface with the third base resin BS3. In an embodiment, for example, the third scatterer SCT3 may include a light scattering material or light scattering particles that scatter at least a portion of the transmissive light.

The first and second wavelength converters WLC1 and WLC2 and the light-transmissive unit LTU may be disposed on the light emitting element layer EML through the second planarization layer OC2 and the first capping layer CAP1, so that the display device may not require a separate substrate for the first and second wavelength converters WLC1 and WLC2 and the light-transmissive unit LTU.

The second capping layer CAP2 may cover the first and second wavelength converters WLC1 and WLC2, the light-transmissive unit LTU and the first light shielding member BK1.

The third planarization layer OC3 may be disposed on the second capping layer CAP2 to planarize upper ends of the first and second wavelength converters WLC1 and WLC2 and the light-transmissive unit LTU. The third planarization layer OC3 may include an organic material.

The second light shielding member BK2 may be disposed in the light shielding area BA on the third planarization layer OC3. The second light shielding member BK2 may overlap the first light shielding member BK1 or the second bank BNK2 in the thickness direction. The second light shielding member BK2 may shield transmission of light.

The first color filter CF1 may be disposed in the first light emission area LA1 on the third planarization layer OC3. The first color filter CF1 may be surrounded by the second light shielding member BK2. The first color filter CF1 may overlap the first wavelength converter WLC1 in the thickness direction. The first color filter CF1 may selectively transmit light of the first color (e.g., red light) and shield or absorb light of the second color (e.g., green light) and light of the third color (e.g., blue light).

The second color filter CF2 may be disposed in the second light emission area LA2 on the third planarization layer OC3. The second color filter CF2 may be surrounded by the second light shielding member BK2. The second color filter CF2 may overlap the second wavelength converter WLC2 in the thickness direction. The second color filter CF2 may selectively transmit light of the second color (e.g., green light), and may shield or absorb light of the first color (e.g., red light) and light of the third color (e.g., blue light).

The third color filter CF3 may be disposed in the third light emission area LA3 on the third planarization layer OC3. The third color filter CF3 may be surrounded by the second light shielding member BK2. The third color filter CF3 may overlap the light-transmissive unit LTU in the thickness direction. The third color filter CF3 may selectively transmit light of a third color (e.g., blue light), and may shield or absorb light of the first color (e.g., red light) and light of the second color (e.g., green light).

The first to third color filters CF1, CF2 and CF3 absorb a portion of light incident from the outside of the display device 10 to reduce reflective light due to external light. Therefore, the first to third color filters CF1, CF2 and CF3 may prevent color distortion due to external light reflection from occurring.

The third passivation layer PAS3 may cover the first to third color filters CF1, CF2 and CF3. The third passivation layer PAS3 may protect the first to third color filters CF1, CF2 and CF3.

The encapsulation member ENC may be disposed on the third passivation layer PAS3. In an embodiment, for example, the encapsulation member ENC may include at least one inorganic layer to prevent oxygen or moisture from being permeated into the display device. In addition, the encapsulation member ENC may include at least one organic layer to protect the display device from particles such as dust.

In an embodiment, as shown in FIG. 3, the roller RP may be disposed in the accommodating portion 500. One end (a first end) of the support 200 is fixed to the fixing bracket 300, which will be described later, and the other end (a second end) of the support 200 may be fixed to the roller RP. The roller RP may be extended along the first direction DR1.

FIG. 4 shows an embodiment of rollable display device in a state where the display panel 100 and the support 200 are rolled and accommodated in the accommodating portion 500. The operation method in which the display panel 100 and the support 200 are rolled will be described later.

In an embodiment, as shown in FIG. 5, the first link of the rollable display device includes a first link P11 at one side (a first side) of the rollable display device and a first link P12 at the other side (a second side) of the rollable display device, and the first link P11 at the one side may be fastened to a second link P21 at one side, which will be described later, and the first link P12 at the other side may be fastened to a second link P22 at the other side, which will be described later.

The second link may include the second link P21 at the one side, which is fastened to the first link P11 at the one side, and the second link P22 at the other side, which is fastened to the first link P12 at the other side.

As shown in FIG. 6, the first link P11 at the one side may include a first fixing portion P11a at one end, and a hole is defined through the first fixing portion P11a in the thickness direction. The connection member BP may be inserted into the hole of the first fixing portion P11a. The connection member BP may be disposed to be fixed to the fixing bracket 300. The connection member BP may be protruded toward the rear surface of the display panel 100. The first fixing portion P11a is fastened to the connection member BP by being inserted into the connection member BP, so that the first link P11 at the one side may be rotated clockwise or counterclockwise.

Although not shown, the first link P12 at the other side may include a second fixing portion at one end, and a hole is defined through the second fixing portion in the thickness direction. The connection member BP may be inserted into the hole of the second fixing portion. The connection member BP may be disposed to be fixed to the fixing bracket 300. The connection member BP may be protruded toward the rear surface of the display panel 100. The second fixing portion is fastened to the connection member BP by being inserted into the connection member BP, so that the first link at the other side may be rotated clockwise or counterclockwise. The connection member BP may include, but is not limited to, a ball bearing. In some embodiments, the connection member BP may be omitted. In such embodiments, the first fixing portion P11a may be directly coupled to the fixing bracket 300. The second fixing portion may be also directly coupled to the fixing bracket 300 in the same manner as the first fixing portion P11a.

As shown in FIG. 7, the first link P11 at the one side may be bolt-nut fastened to the second link P21 at one side. The other end of the first link P11 at the one side may include a nut, and one end of the second link P21 at the one side may include a bolt. As the second link P21 at the one side is rotated by the driver, an insertion length of the second link P21 at the one side into the first link P11 at the one side may be adjusted. In an embodiment, for example, as the second link P21 on the one side is rotated by the driver clockwise, the insertion length of the second link P21 at the one side into the first link P11 at the one side may be increased, and as the second link P21 at the one side is rotated by the driver counterclockwise, the insertion length of the second link P21 at the one side into the first link P11 at the one side may be shortened. Although not shown, the first link P12 at the other side may be bolt-nut fastened to the second link P22 at the other side. The other end of the first link P12 at the other side may include a nut, and the other end of the second link P22 at the other side may include a bolt. As the second link P22 at the other side is rotated by the driver, the insertion length of the second link P22 at the other side into the first pink P12 at the other side may be adjusted. In an embodiment, for example, as the second link P22 at the other side is rotated by the driver clockwise, the insertion length of the second link P22 at the other side into the first link P12 at the other side is increased, and as the second link P22 at the other side is rotated by the driver counterclockwise, the insertion length of the second link P22 at the other side into the second link P12 at the other side may be shortened. That is, the rotational direction of the second link P21 at the one side and the second link P22 at the other side may be the same as each other by the driver.

In an embodiment, when the roller RP is rotated by the driver in one direction (e.g., a clockwise direction), the insertion length of the second link P21 at one side into the first link P11 at the one side is reduced, so that the display panel 100 may be rolled. In such an embodiment, when the roller RP is rotated by the driver in the other direction (e.g., a counterclockwise direction), the insertion length of the second link P21 at one side into the first link P11 at the one side is increased, so that the display panel 100 may be unrolled. In such an embodiment, although not shown, when the roller RP is rotated by the driver RP in one direction (e.g., the clockwise direction), the insertion length of the second link P22 at the other side into the first link P12 at the other side is reduced, so that the display panel 100 may be rolled. When the roller RP is rotated by the driver in the other direction (e.g., the counterclockwise direction), the insertion length of the second link P22 at the other side into the first link P12 at the other side is increased, so that the display panel 100 may be unrolled.

As shown in FIGS. 8 and 9, an embodiment of the driver of the rollable display device may include a motor 610.

The driver may further include a motor rotatory shaft 615 connected to the motor 610, a connection rotary shaft 640 facing the motor rotary shaft 615, and a belt 620 surrounding the motor rotary shaft 615 and the connection rotary shaft 640, in addition to the motor 610.

When the motor rotary shaft 615 is rotated by the motor 610, the connection rotary shaft 640 connected to the motor rotary shaft 615 through the belt 620 may be rotated in a same direction as the motor rotary shaft 615. The connection rotary shaft 640 may be extended along the first direction DR1 (see FIG. 5).

The connection rotary shaft 640 may further include a first fixing portion 641 which fixes ends of a first shaft of a first joint 651 to one end thereof, and a second fixing portion 645 which fixes ends of a first shaft of a second joint 655 to the other end thereof. The first shaft may be extended along the third direction DR3 (see FIG. 1A). In an embodiment, the connection rotary shaft 640 may be fixed by supporting members 631 and 635. That is, the connection rotary shaft 640 may be fixed to the supporting members 631 and 635 by passing through holes of the supporting members 631 and 635.

The second link P21 at one side includes a third fixing portion P21a which fixes ends of the second shaft crossing the first shaft of the first joint 651 to the other end thereof, and the second link P22 at the other side may include a fourth fixing portion P22a which fixes the ends of the second shaft crossing the first shaft of the second joint 655 to the other end thereof. The second shaft may be extended along the second direction DR2 (see FIG. 1A).

Figure 10:
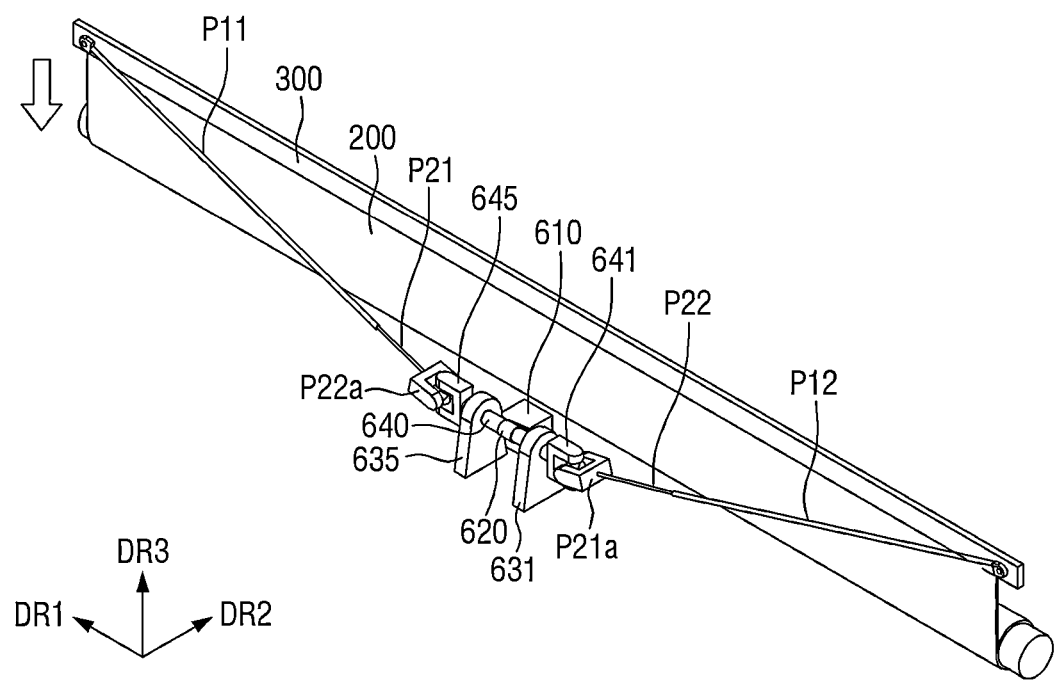
FIG. 10 is a perspective view illustrating a rear surface of a rollable display device of FIG. 1A.

FIG. 10 is a perspective view illustrating a rear surface of the rollable display of FIG. 1A.

Referring to FIG. 10, when the roller RP is rotated by the driver in one direction (e.g., clockwise), the insertion length of the second link P21 at the one side into the first link P11 at the one side is reduced, so that the second link P21 at one side and the first link P11 at the one side, which are connected to each other, and the second link P22 at the other side and the first link P12 at the other side, which are connected to each other, may be laid down, so that the fixing bracket 300 connected to each of the first link P11 at the one side and the first link P12 at the other side may be lowered. As described above, the display panel 100 and the support 200 are rolled as the roller RP is rotated by the driver in one direction. As the display panel 100 and the support 200 are rolled, the fixing bracket 300 may be simultaneously lowered.

Hereinafter, the rollable display device according to an alternative embodiment will be described.

Figure 11:
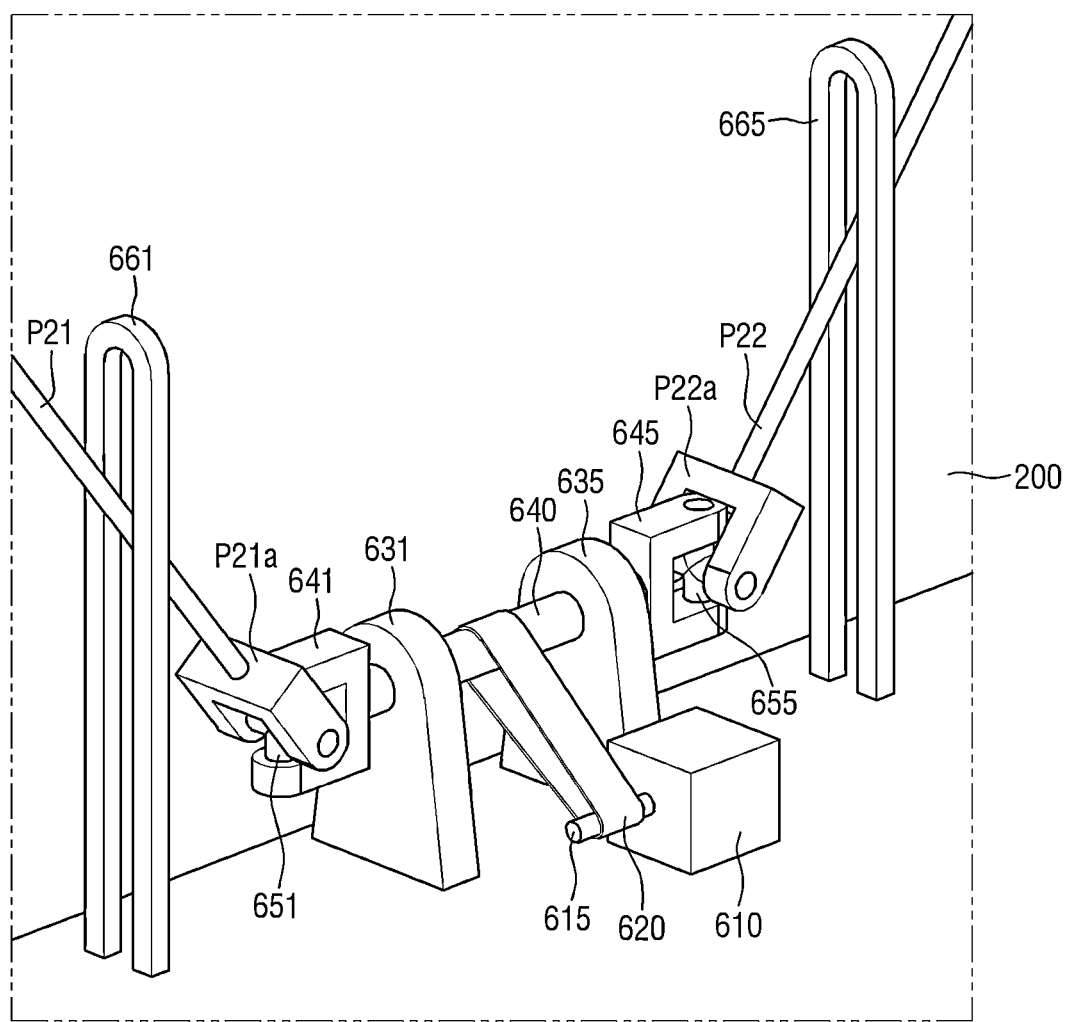
FIG. 11 is a perspective view illustrating a driver and a fixing member of a rollable display device according to an alternative embodiment.

FIG. 11 is a perspective view illustrating a driver and a fixing member of a rollable display device according to an alternative embodiment.

The rollable display device shown in FIG. 11 is substantially the same as the rollable display device of FIGS. 1A to 10 except that the rollable display device further includes fixing members 661 and 665.

In an embodiment, as shown in FIG. 11, the fixing members 661 and 665 may include a first fixing member 661 connected to the second link P21 at the one side and a second fixing member 665 connected to the second link P22 at the other side. Each of the first fixing member 661 and the second fixing member 665 may have a U-like shape. The first fixing member 661 may fix the second link P21 at the one side, and the second fixing member 665 may fix the second link P22 at the other side. The first fixing member 661 and the second fixing member 665 may fix the second link P21 at the one side and the second link P22 at the other side, respectively, so that movement of the second link P21 at the one side and the second link P22 at the other side may be minimized in the second direction DR2 (see FIG. 1A). Although not shown, lower ends of the fixing members 661 and 665 may be fixed by being accommodated in the accommodating portion (500 of FIG. 1A).

Since the other elements are the same as those described above with reference to FIGS. 1A to 10, any repetitive detailed description thereof will be omitted hereinafter.

Figure 12:
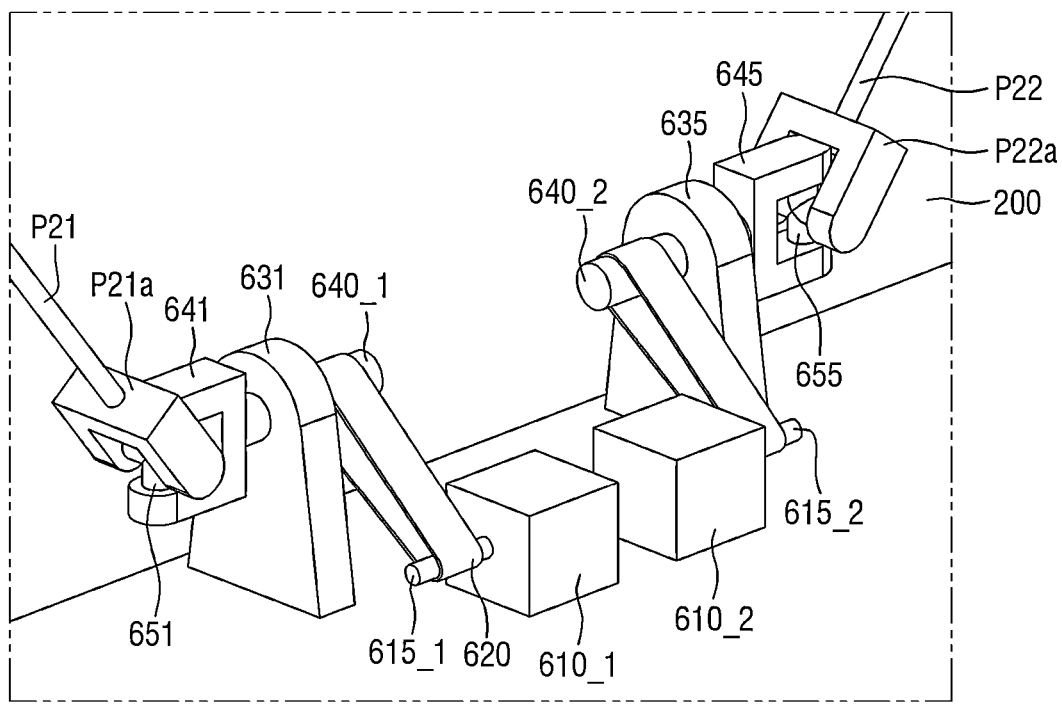
FIG. 12 is a detailed perspective view illustrating a driver of a rollable display device of FIG. 5 according to an alternative embodiment.

FIG. 12 is a detailed perspective view illustrating a driver of a rollable display device of FIG. 5 according to an alternative embodiment.

The driver of FIG. 12 is substantially the same as that of FIG. 8 except that the driver includes two motors 610_1 and 610_2.

In an embodiment, as shown in FIG. 12, the driver may include a first motor 610_1 and a second motor 610_2 spaced apart from the first motor 610_1. Driving of the first motor 610_1 and driving of the second motor 610_2 may be simultaneously controlled by a same controller (not shown). In an embodiment, where the driving of the motors is simultaneously controlled, the motor rotary shafts 615_1 and 615_2 respectively connected to the motors 610_1 and 610_2 rotate in a same rotational direction. In such an embodiment, the driver may further include a first motor rotary shaft 615_1 connected to the first motor 610_1 and a second motor rotary shaft 615_2 connected to the second motor 610_2. Furthermore, the connection rotary shaft (640 of FIG. 8), which is integrally formed in the embodiment shown in FIG. 8, may be separated. That is, the connection rotary shafts 640_1 and 640_2 may include a first connection rotary shaft 640_1 connected to the first motor rotary shaft 615_1 and a second connection rotary shaft 640_2 connected to the second motor rotary shaft 615_2. The first and second connection rotary shafts 640_1 and 640_2 may be fixed to the supporting members 631 and 635 by passing through the holes of the supporting members 631 and 635, respectively.

Since the other elements are the same as those described above with reference to FIGS. 1A to 10, any repetitive detailed description thereof will be omitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A rollable display device comprising:
   a display panel;
   a support disposed on a rear surface of the display panel;
   a fixing bracket to which a first end of the support and a first end of the display panel are fixed;
   a roller to which a second end of the support is fixed;
   a first link including a first end coupled to the fixing bracket;
   a second link including a first end fastened to a second end of the first link; and
   a driver connected to a second end of the second link,
   wherein the second link is rotated by the driver.

2. The rollable display device of claim 1, wherein the second link is bolt-nut fastened to the first link.

3. The rollable display device of claim 2, wherein the first end of the second link includes a bolt, and the second end of the first link includes a nut.

4. The rollable display device of claim 3, wherein an insertion length of the second link into the first link is adjusted as the second link is rotated by the driver.

5. The rollable display device of claim 4, wherein
   the display panel is rolled as the insertion length of the second link into the first link is reduced, and
   the display panel is unrolled as the insertion length of the second link into the first link is increased.

6. The rollable display device of claim 1, wherein
   the first end of the first link is coupled to the fixing bracket through a connection member, and
   the connection member includes a ball bearing.

7. The rollable display device of claim 1, wherein the driver includes a motor.

8. The rollable display device of claim 7, wherein the driver includes a motor rotary shaft connected to the motor, a connection rotary shaft facing the motor rotary shaft, and a belt surrounding the motor rotary shaft and the connection rotary shaft.

9. The rollable display device of claim 8, wherein the connection rotary shaft connected to the motor rotary shaft through the belt is rotated in a same direction as the motor rotary shaft when the motor rotary shaft is rotated by the motor.

10. The rollable display device of claim 9, wherein the connection rotary shaft includes a first end portion and a second end portion,
    The first end portion includes a first fixing portion which fixes ends of a first shaft of a first joint, and
    the second end portion includes a second fixing portion which fixes ends of a first shaft of a second joint.

11. The rollable display device of claim 10, wherein
    the second link includes a second link at a first side and a second link at a second side,
    the second link at the first side includes a third fixing portion which fixes ends of a second shaft crossing the first shaft of the first joint to the other end, and
    the second link at the second side includes a fourth fixing portion which fixes ends of a second shaft crossing the first shaft of the second joint to the other end.

12. The rollable display device of claim 11, wherein
    the first link includes a first link at a first side, and a first link at a second side,
    the first link at the first side is fastened to the second link at the first side, and the first link at the second side is fastened to the second link at the second side.

13. The rollable display device of claim 12, wherein the first link at the first side is bolt-nut fastened to the second link at the first side.

14. The rollable display device of claim 13, wherein the first link at the second side is bolt-nut fastened to the second link at the second side.

15. The rollable display device of claim 14, wherein
the first link at the first side is fixed to a first side of the fixing bracket through a first connection member, and
the first link at the second side is fixed to a second side of the fixing bracket through a second connection member.

16. The rollable display device of claim 15, wherein the second link at the first side and the second link at the second side are rotated by the driver in a same direction as each other.

17. A rollable display device comprising:
a display panel;
a fixing bracket to which a first end of the display panel is fixed;
a first link at a first side and a first link at a second side, which are rotatably coupled to sides of the fixing bracket, respectively;
a second link at a first side connected to the first link at the first side, and a second link at a second side connected to the first link at the second side; and
a driver which simultaneously rotates the second link at the first side and the second link at the second side.

18. The rollable display device of claim 17, wherein the second link at the first side and the second link at the second side are rotated by the driver in a same direction as each other.

19. The rollable display device of claim 17, wherein the first link at the first side is bolt-nut fastened to the second link at the first side, and the first link at the second side is bolt-nut fastened to the second link at the second side.

20. The rollable display device of claim 17, wherein the first link at the first side and the first link at the second side are coupled to each other through a connection member of the fixing bracket, and the connection member includes a ball bearing.

* * * * *